(12) United States Patent
Yamazaki et al.

(10) Patent No.: US 11,999,616 B2
(45) Date of Patent: Jun. 4, 2024

(54) DIELECTRIC THIN FILM, CAPACITOR ELEMENT, AND ELECTRONIC CIRCUIT BOARD

(71) Applicant: TDK CORPORATION, Tokyo (JP)

(72) Inventors: Kumiko Yamazaki, Tokyo (JP); Wakiko Sato, Tokyo (JP); Junichi Yamazaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 654 days.

(21) Appl. No.: 17/269,698

(22) PCT Filed: Aug. 27, 2019

(86) PCT No.: PCT/JP2019/033545
§ 371 (c)(1),
(2) Date: Feb. 19, 2021

(87) PCT Pub. No.: WO2020/045447
PCT Pub. Date: Mar. 5, 2020

(65) Prior Publication Data
US 2021/0238037 A1    Aug. 5, 2021

(30) Foreign Application Priority Data

Aug. 31, 2018  (JP) ................................. 2018-163799

(51) Int. Cl.
| | |
|---|---|
| *C01B 21/082* | (2006.01) |
| *C01G 35/00* | (2006.01) |
| *C23C 14/06* | (2006.01) |
| *H01G 4/12* | (2006.01) |
| *H01G 4/30* | (2006.01) |
| *H01G 4/33* | (2006.01) |
| *H01L 49/02* | (2006.01) |
| *H05K 1/16* | (2006.01) |

(52) U.S. Cl.
CPC ........ *C01B 21/0821* (2013.01); *C01G 35/006* (2013.01); *C23C 14/0676* (2013.01);
(Continued)

(58) Field of Classification Search
None
See application file for complete search history.

(56) References Cited

U.S. PATENT DOCUMENTS

| | | | |
|---|---|---|---|
| 2007/0097597 A1 | 5/2007 | Ko et al. | |
| 2018/0282229 A1* | 10/2018 | Yamazaki | ......... C04B 35/58007 |
| 2019/0202744 A1 | 7/2019 | Yamazaki et al. | |

FOREIGN PATENT DOCUMENTS

| | | |
|---|---|---|
| JP | 2007-126661 A | 5/2007 |
| WO | 2017/135298 A1 | 8/2017 |

OTHER PUBLICATIONS

Pichler, M., et al. "LaTiOxNy Thin Film Model Systems for Photocatalytic Water Splitting: Physicochemical Evolution of the Solid-Liquid Interface and the Role of the Crystallographic Orientation." Adv. Funct. Mater. 2017, 27, 1605690. (Year: 2017).*

(Continued)

*Primary Examiner* — Anthony J Zimmer
*Assistant Examiner* — Zachary John Baum
(74) *Attorney, Agent, or Firm* — Oliff PLC

(57) ABSTRACT

A capacitive element and a dielectric thin film having a small dielectric loss and a large relative permittivity, particularly at low frequencies. [Solution] This dielectric thin film includes an A-B—O—N oxynitride. When the A-B—O—N oxynitride is represented by the compositional formula $A_a B_b O_o N_n$, $(o+n)/a<3.00$ is satisfied.

6 Claims, 4 Drawing Sheets

(52) U.S. Cl.
CPC ......... *H01G 4/1218* (2013.01); *H01G 4/1254* (2013.01); *H01G 4/306* (2013.01); *H01G 4/33* (2013.01); *H01L 28/40* (2013.01); *H05K 1/162* (2013.01); *C01P 2002/72* (2013.01); *C01P 2006/40* (2013.01)

(56) References Cited

OTHER PUBLICATIONS

Kane, W. F., et al. "Use of SiBN and SiBON films prepared by plasma enhanced chemical vapor deposition from borazine as interconnection dielectrics." J. Electrochem. Soc. 144, 658 (1997). (Year: 1997).*

Weller, M. and Skinner, S. Neutron and X-ray powder diffraction studies of the oxynitrides SrW(O,N)3, Ba3W2(O,N)8 and Ba3Mo2(O,N)8. International Journal of Inorganic Materials 2 (2000) 463-467. (Year: 2000).*

Maillard, P., et al. Thermal ammonolysis study of the rare-earth tantalates RTaO4. Chem. Mater. 2005, 17, 152-156. (Year: 2005).*

Pichler, M., et al. Determination of conduction and valence band electronic structure of LaTiOxNy thin film. ChemSusChem 2017, 10, 2099-2106. (Year: 2017).*

Maeno, Y. et al. Magneto-optical memory media using BaTiON protective films. J. Appl. Phyl. 68, 4325-4326 (1990). (Year: 1990).*

Mar. 2, 2021 International Preliminary Report on Patentability issued in International Patent Application No. PCT/JP2019/033545.

* cited by examiner

1

DIELECTRIC THIN FILM, CAPACITOR ELEMENT, AND ELECTRONIC CIRCUIT BOARD

TECHNICAL FIELD

The present invention relates to a dielectric thin film, a capacitor element, and an electronic circuit board.

BACKGROUND

In recent years, as digital devices have attained higher performances, a high-performance dielectric composition with high performance is also demanded. Further, a dielectric composition made by introducing a defect to a perovskite type oxide has been researched.

For example, Patent Document 1 discloses a dielectric composition having an improved relative permittivity by introducing a defect in a crystal lattice of barium titanate by adding an additive to a barium titanate powder.

However, dielectric compositions with even more various compositions are in demand, and a dielectric composition having an improved relative permittivity regardless of presence of the additives is in demand.

[Patent Document 1] JP Patent Application Laid Open No. 2007-126661

SUMMARY

The present invention is achieved in view of such circumstances and the object is to provide a dielectric thin film, a capacitor element, and an electronic circuit board having a large relative permittivity and a small dielectric loss particularly under low frequency.

The dielectric thin film according to the present invention includes an A-B—O—N type oxynitride in which the A-B—O—N type oxynitride represented by a compositional formula of $A_aB_bO_oN_n$, satisfies $(o+n)/a<3.00$.

By satisfying the above-mentioned characteristics, the dielectric thin film according to the present invention achieves an increased relative permittivity particularly at a low frequency such as a frequency of 1 kHz or so and a dielectric loss can be decreased.

The dielectric thin film according to the present invention may satisfy $(o+n)/a<2.95$.

The dielectric thin film according to the present invention may satisfy $n/a<0.050$.

In the dielectric thin film according to the present invention, A may be one or more selected from Sr, Ba, Ca, La, Nd, Na, and K; and B may be one or more selected from Ta, Nb, Ti, and W.

In the dielectric thin film according to the present invention, a crystal structure of the A-B—O—N type oxynitride may be a non-perovskite type structure.

A capacitor element according to the present invention includes the above-mentioned dielectric thin film.

An electronic circuit board according to the present invention includes a thin film capacitor having the above-mentioned dielectric thin film.

DETAILED DESCRIPTION

Hereinbelow, the present invention is described based on embodiments.

Figure 1:
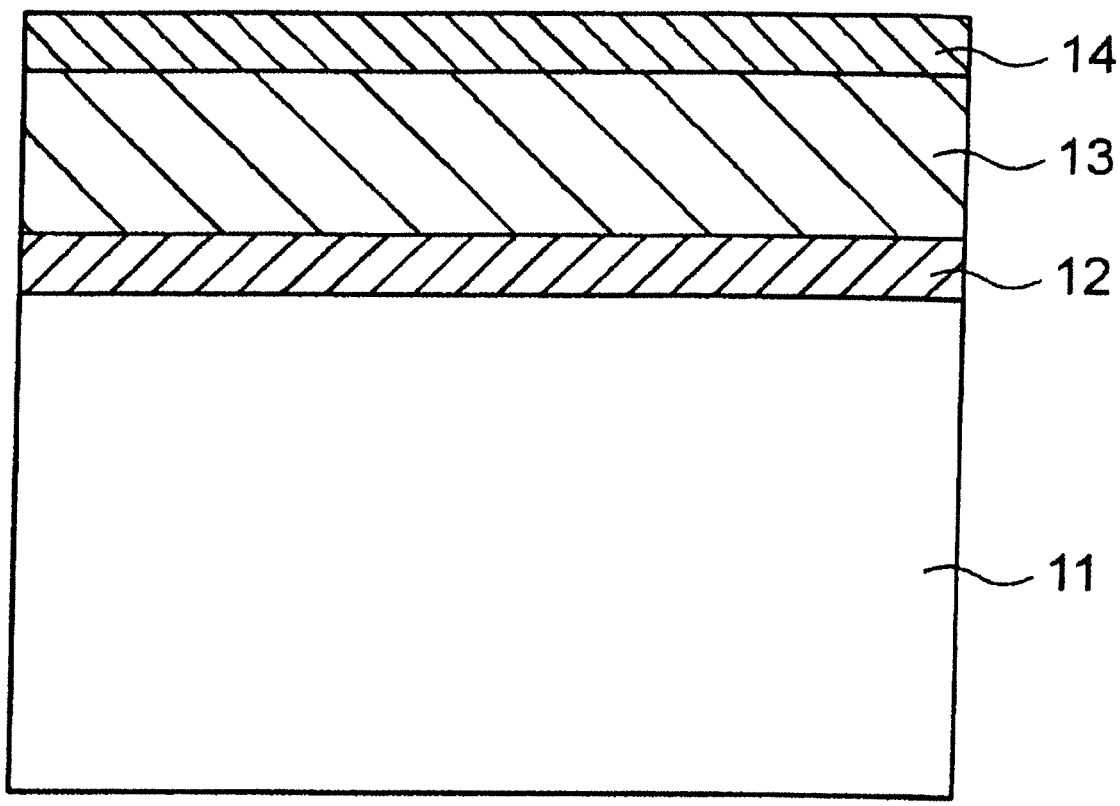
FIG. 1 is a schematic diagram of a thin film capacitor according to one embodiment of the present invention.

FIG. 1 shows a schematic diagram of a thin film capacitor having a dielectric thin film according to the present embodiment. The thin film capacitor 1 shown in FIG. 1 includes a first electrode 12 and a dielectric thin film 13 which are formed on a substrate 11 in this order, and a second electrode 14 on the dielectric thin film 13.

A material of the substrate 11 is not particularly limited, and a Si single crystal substrate may be used as the substrate 11 since it is easy to obtain and also it is excellent from the point of cost. In case flexibility is an important factor, then a Ni foil can be used as the substrate.

Materials of the first electrode 12 and the second electrode 14 are not particularly limited as long as these function as an electrode. For example, as the materials of the first electrode 12 and the second electrode 14, Pt, Ag, Ni, and the like may be mentioned. A thickness of the first electrode 12 is preferably 0.01 to 10 μm. A thickness of the second electrode 14 is preferably 0.01 to 10 μm.

The dielectric thin film 13 is a polycrystalline dielectric thin film including the A-B—O—N type oxynitride. By including the A-B—O—N type oxynitride, a relative permittivity around a frequency of 1 kHz or so of the dielectric thin film can be increased, and a dielectric loss (tan δ) can be decreased. Also, the dielectric thin film 13 may be preferably a polycrystalline dielectric thin film, and it may be preferably a different type of thin film from an epitaxial film. An XRD pattern can be used to verify that the dielectric thin film 13 is a polycrystalline dielectric thin film which is a different type of thin film from an epitaxial film.

Types of A and B are not particularly limited, and these may be those capable of forming an A-B—O type oxide which is a perovskite type structure, that is an oxide having a crystal structure of an $ABO_3$ type structure. Also, A preferably may be one or more element selected from Sr, Ba, Ca, La, Nd, Na, and K; and B preferably may be one or more selected from Ta, Nb, Ti, and W. Also, A most preferably may be Sr; and B most preferably may be Ta.

A composition of the A-B—O—N type oxynitride can be represented by a compositional formula $A_aB_bO_oN_n$ in terms of atomic ratio. Also, the dielectric thin film 13 is thought to include the A-B—O—N type oxynitride when an N content is 0.0001 mol % or more with respect to 100 mol % of a total content of all of the elements included in the A-B—O—N type oxynitride. Also, the content of each element of A, B, and O is similarly 0.0001 mol % or more.

The composition of the dielectric thin film is represented by a compositional formula $A_aB_bO_oN_n$ which satisfies $(o+n)/a<3.00$. By satisfying $(o+n)/a<3.00$, the relative permittivity at a frequency around 1 kHz or so can be improved.

Also, a/b is not particularly limited, and it does not necessarily have to be a/b=1.0. Specifically, it may be $0.7 \leq a/b \leq 1.3$.

Also, more preferably $(o+n)/a<2.95$ may be satisfied, and even more preferably $(o+n)/a<2.85$ may be satisfied. Note that, a lower limit of $(o+n)/a$ is not particularly limited. For example, the lower limit may be $(o+n)/a \geq 2.00$.

Also, n/a≤0.050 may be satisfied.

A method for measuring the composition of the A-B—O—N type oxynitride included in the dielectric thin film 13 is not particularly limited. For example, as the method for measuring, an X-ray photoelectron spectroscopy, an impulse heat melting extraction method (an infrared absorbing method), and the like may be mentioned.

The composition of the A-B—O—N type oxynitride at a surface part of the dielectric thin film 13 may be different from the composition of the A-B—O—N type oxynitride at an inner part of the dielectric thin film 13. The surface part of the dielectric thin film 13 refers to a part which is within 10 nm or less from a surface of the dielectric thin film 13. The inner part of the dielectric thin film 13 refers to a part which is 30 nm or deeper from the surface of the dielectric thin film 13. In the present embodiment, the compositional formula of the A-B—O—N type oxynitride at the surface part of the dielectric thin film is represented by $A_{a1}B_{b1}O_{o1}N_{n1}$ in terms of atomic ratio.

Also, (o1+n1)/a1<3.00 may be satisfied. By satisfying (o1+n1)/a1<3.00, the relative permittivity at a frequency of 1 kHz or so can be improved.

Also, a1/b1 is not particularly limited, and a1/b1=1.0 does not necessarily have to be satisfied. Specifically, $0.7 \leq a1/b1 \leq 1.3$ may be satisfied.

Also, further preferably (o1+n1)/a1<2.95 may be satisfied. Note that, a lower limit of (o1+n1)/a1 is not particularly limited. For example, (o1+n1)/a1≥2.00 may be satisfied.

Also, n1/a1≤0.500 may be satisfied.

A method for measuring the composition of the A-B—O—N type oxynitride at the surface part of the dielectric thin film is not particularly limited. For example, an X-ray photoelectron spectroscopy, an impulse heat melting extraction method (an infrared absorbing method), and the like may be mentioned.

The thickness of the dielectric thin film is not particularly limited, and preferably it may be 10 nm to 1 µm.

The crystal structure of the A-B—O—N type oxynitride included in the surface part and/or the inner part of the dielectric thin film 13 is not particularly limited, and preferably it may be a non-perovskite structure. By having the non-perovskite structure, the relative permittivity at a frequency of 1 kHz or so can be improved. Here, the non-perovskite structure refers to a structure other than a perovskite structure. The A-B—O—N type oxynitride refers to a crystal structure other than an $ABO_2N$ type structure.

A method for verifying whether the A-B—O—N oxynitride included in the surface part and/or the inner part of the dielectric thin film 13 has a perovskite structure or a non-perovskite structure is not particularly limited. For example, by measuring an XRD pattern, it can be verified whether the A-B—O—N type oxynitride has a perovskite structure or a non-perovskite structure.

Figure 4:
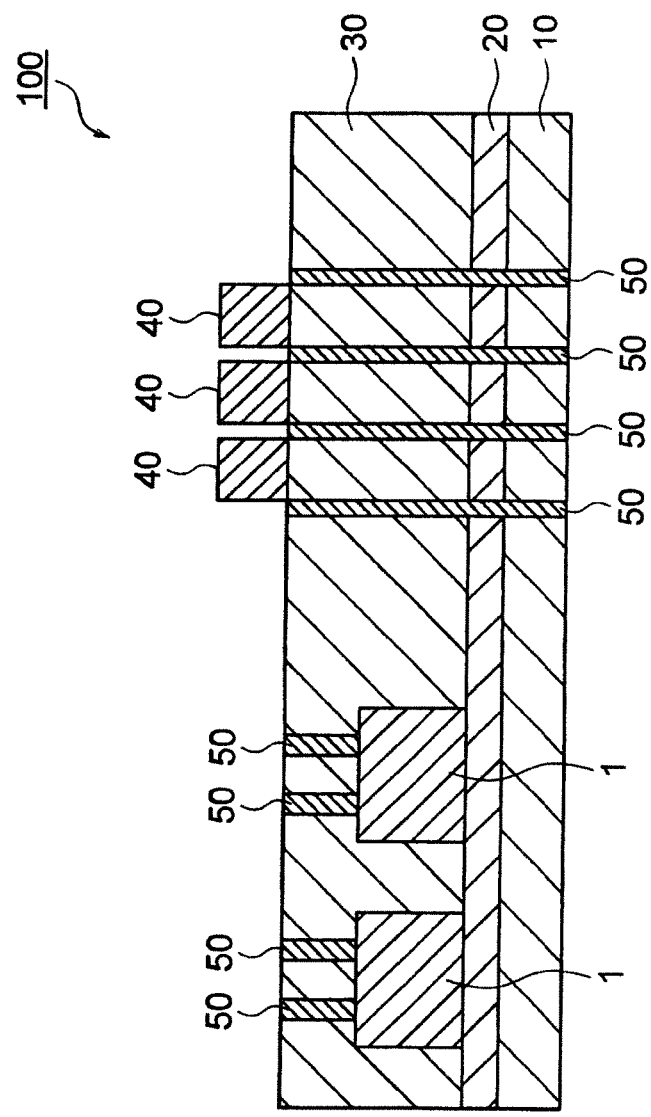
FIG. 4 is a schematic diagram of an electronic circuit board according to one embodiment of the present invention.

As shown in FIG. 4, the electronic circuit board 100 according to the present embodiment includes an epoxy based resin substrate 10, a resin layer 20 formed on the epoxy based resin substrate 10, a thin film capacitor 1 provided on the resin layer 20, an insulation coating layer 30 formed on the resin layer 20 provided with the thin film capacitor 1, an electronic component 40 provided on the insulation coating layer 30, and a metal wire 50 connecting to the thin film capacitor 1 or the electronic component 40 and pulled out to a surface of the epoxy based resin substrate 10 or to a surface of the insulation coating layer 30. The thin film capacitor 1 may or may not be removed from the substrate 11. A part of the metal wire 50 penetrates through the electronic circuit board 100 in order to conduct between the surface of the epoxy based resin substrate 10 and the surface of the insulation coating layer 30. A type of the metal wire 50 is not particularly limited. For example, the metal wire 50 may be Cu and the like. In the embodiment shown in FIG. 4, the thin film capacitor 1 is embedded in the electronic circuit board 100.

Method for Producing Thin Film Capacitor 1

Next, a method for producing the thin film capacitor 1 which is one example of a capacitor element is described. Hereinbelow, Sr is used for A and Ta is used for B to explain, however the same applies even in case of using other type of elements.

A method for forming a thin film which becomes the dielectric thin film 13 at the end is not particularly limited. For example, a vacuum deposition method, a spattering method, a PLD method (pulse laser deposition method), a MO-CVD method (organic metal chemical vapor deposition method), a MOD method (organic metal decomposition method), a sol-gel method, a CSD method (chemical solution deposition method), and the like may be mentioned. Also, trace amounts of impurities and subcomponents may be included in raw materials used for forming the dielectric thin film as long as it does not significantly compromise the performance of the thin film. Also, the dielectric thin film 13 according to the present embodiment may include trace amounts of impurities and subcomponents as long as the performance of the thin film is not compromised significantly.

Among the above-mentioned methods for forming the thin film, when a PLD method, a spattering method, a CSD method, and the like are used as the method for forming the thin film; the thin film obtained at the end tends to easily form a polycrystalline film. In the present embodiment, a PLD method as the method for forming the thin film is explained.

First, a Si single crystal substrate as the substrate 11 is prepared. Then, $SiO_2$, $TiO_x$, and Pt are formed on the Si single crystal substrate in this order to form the first electrode 12 made of Pt. A method for forming the first electrode 12 is not particularly limited. For example, a spattering method, CVD, and the like may be mentioned.

Next, a metal oxide thin film is formed on the first electrode 12 by a PLD method. Also, depending on the purpose of use, a metal mask may be used to form a region to which a thin film is partially not formed in order to expose a part of the first electrode 12.

In a PLD method, first, a target including constitutional elements (Sr and/or Ta) of the polycrystalline dielectric thin film is placed inside a film forming chamber. Next, a pulse laser is irradiated to a surface of the target. Due to strong energy of the pulse laser, the surface of the target is evaporated instantaneously. Thereby, the evaporated materials are deposited to the substrate which is placed facing against the target, and the metal oxide thin film is formed. Note that, a compositional formula of the metal oxide thin film is $SrTaO_x$.

A type of the target is not particularly limited, and a metal oxide sintered body including the constitutional elements (Sr and/or Ta) of the polycrystalline dielectric thin film to be formed, a simple metal of the constitutional element, an alloy of the constitutional elements, and the like may be mentioned. Also, in the target, preferably each element may be evenly distributed, however the distribution of each element may vary within a range which does not influence the quality of the obtained polycrystalline dielectric thin film. Further, the target does not necessarily have to be one, and plurality of targets including parts of the constitutional elements of the polycrystalline dielectric thin film can be used for forming. A shape of the target is not particularly limited, and it may be a shape suited for a film forming machine being used. Also, by regulating film forming conditions such as an oxygen gas pressure and the like, x of the obtained metal oxide thin film can be controlled. For example, by controlling the oxygen gas pressure and by decreasing an oxygen partial pressure (a film forming oxygen partial pressure) in the atmosphere while forming the metal oxide thin film, x becomes smaller, and more defects occur to the crystal lattice (more sites without being introduced anything). On the other hand, by increasing the oxygen partial pressure in the atmosphere while forming the metal oxide thin film, x becomes larger, and a number of defects in the crystal lattice decreases.

In the present embodiment, for example, a sintered body including $Sr_2Ta_2O_7$ may be used as a target. Further, by regulating the film forming conditions such as an oxygen gas pressure and the like, the above-mentioned x obtained at the end can be controlled. Note that, in the present embodiment, the metal oxide of the metal oxide thin film may be $SrTaO_x$ in which $3.2 \leq x \leq 3.8$ may be satisfied.

Also, when a PLD method is used, in order to crystallize the metal oxide thin film formed, heating may be performed by applying an infrared laser to the substrate 11 while forming the metal oxide thin film. A heating temperature may vary depending on the constitution elements and the compositions of the metal oxide thin film and the substrate 11, and for example the substrate may be heated to a temperature of 600° C. to 800° C. By making the temperature of the substrate 11 to a suitable temperature, the metal oxide thin film tends to easily crystallize and also cracking can be prevented while cooling is performed.

By performing a nitriding treatment by irradiating nitrogen radicals to the metal oxide thin film while forming it, nitrogen can be introduced to the metal oxide thin film, at least to the surface of the metal oxide thin film, and the dielectric thin film 13 of the present embodiment can be obtained. The nitriding treatment may be performed by introducing nitrogen radicals while forming the metal oxide thin film. However, in order to control the amount of nitrogen introduced so that an excess amount of nitrogen is not introduced, it may be easier and preferable to perform the nitriding treatment by irradiating nitrogen radicals to the metal oxide thin film after being formed. Note that, when the nitriding treatment is performed by irradiating nitrogen radicals to the formed metal oxide thin film, a nitrogen content at the inner part of the dielectric thin film 13 is usually lesser than a nitrogen content at the surface of the dielectric thin film 13. Also, as an irradiation time of nitrogen radicals to the metal oxide thin film becomes shorter, the relative permittivity of the dielectric thin film tends to easily improve. This is thought to be caused as the irradiation time of nitrogen radicals to the metal oxide thin film becomes longer, the dielectric thin film 13 is damaged more by nitrogen radicals.

In case the dielectric thin film 13 is obtained by the above-mentioned method, the inner part of the dielectric thin film 13 is substantially uniform. Therefore, when the composition of the inner part of the dielectric thin film 13 is measured by an X-ray photoelectron spectroscopy, an impulse heat melting extraction method (an infrared absorbing method), and the like, a composition is measured by selecting one measurement point, and thereby the obtained composition can be determined as the composition of the inner part of the dielectric thin film 13. Also, regarding the composition of the surface of the dielectric thin film 13, preferably compositions are measured by selecting three or more measurement points and an average is calculated.

Lastly, by forming the second electrode 14 on the dielectric thin film 13, the thin film capacitor 1 can be produced. Note that, the material of the second electrode 14 is not particularly limited, and Ag, Au, Cu, and the like can be used. Also, a method for forming the second electrode 14 is not particularly limited. For example, the second electrode 14 may be formed by a spattering method.

Regarding the dielectric thin film 13 of the present embodiment, the reason of the improvement of the relative permittivity particularly at a frequency of 1 kHz or so is thought as discussed in below.

The present inventors have found that in $SrTaO_xN_y$ which is a typical example of an A-B—O—N oxynitride, a crystal lattice tends to become larger as N content (y) increases. This is thought to be caused because N atom is larger than O atom.

On the contrary to this, the present inventors have found that in $SrTaO_xN_y$ which is a typical example of an A-B—O—N oxide, a crystal lattice tends to become smaller as O content (x) increases. This is thought to be caused because O atom is larger than a defect.

Here, in case of introducing N to the metal oxide thin film formed of $SrTaO_x$, the crystal lattice strain becomes larger after N is introduced as x becomes smaller, more defects are formed, and the crystal lattice becomes smaller. This is because N atom is larger than a defect or O atom, therefore the smaller the crystal lattice is before N is introduced, the larger the crystal lattice strain is after N is introduced.

On the other hand, when x is large, defects are few, and the crystal lattice is large, it is thought that the crystal lattice strain is small after N is introduced. Also, when x is large or when an introduced amount of N is too much, a total content of O and N increases, and defects are decreased, thus it is thought that a crystal lattice strain becomes smaller.

Here, the relative permittivity of the polycrystalline dielectric thin film is derived mainly from an ionic polarization and a space charge polarization. Also, a polarization by N atom and defects is categorized as a space charge polarization. Here, when the ionic polarization and a space charge polarization are compared, an ionic polarization has larger influence at a high frequency of 1 MHz or so. On the other hand, the space charge polarization has larger influence at a low frequency of 1 kHz or so. Therefore, in the dielectric thin film 13 according to the present embodiment, the relative permittivity tends to become large and the dielectric loss (tan δ) tends to become small at a low frequency f 1 kHz or so.

For example, the electronic circuit board 100 is produced as described in below, however it is not limited thereto. First, a pre-cured resin layer which is a precursor of the resin layer 20 is formed to an epoxy based resin substrate 10. Further, the thin film capacitor 1 is mounted on the pre-cured resin layer so that the pre-cured resin layer and the first electrode 11 of the thin film capacitor 1 face against each other. Note that, the thin film capacitor 1 may or may not be removed from the substrate 11. Next, the insulation coating layer 30 is formed on the pre-cured resin layer mounted with the thin film capacitor 1, and the thin film capacitor 1 is placed between the epoxy based resin substrate 10 and the insulation coating layer 30. Next, the resin layer 20 is formed by heat curing the pre-cured resin layer, and also the epoxy based resin substrate 10 and the insulation coating layer 30 are press adhered. A method of press adhesion is not particularly limited. For example, it may be a method by heat pressing. Next, a through hole is formed, and a metal wire 50 is formed in the through hole, then the electronic component 40 is mounted on the insulation coating layer 30. Thereby, an electronic circuit board 100 embedded with the thin film capacitor 1 inside is obtained. Note that, the pre-cured resin layer may be formed by a B stage epoxy resin and the like which is in a pre-cured state at room temperature and heat cures by heating. Also, the insulation coating layer 30 may be formed from a resin such as an epoxy resin, Teflon (registered trademark) based resin, a polyimide resin, or the like.

Hereinabove, the embodiment of the present invention is described, however the present invention is not limited to such embodiment and various modifications can be performed within the scope of the present invention. For example, the thin film capacitor 1 of the electronic circuit board 100 may be mounted by surface mounting.

Note that, a capacitor element according to the present invention is an element which uses dielectric properties, and it includes, condensers, thermistors, filters, diplexers, resonators, antennas, piezoelectric elements, transistors, ferroelectric memories, and the like. The polycrystalline dielectric thin film according to the present embodiment is suitably used for a capacitor element which is demanded to have a high relative permittivity and a low dielectric loss particularly at a frequency of 1 kHz or so.

EXAMPLES

Hereinafter, the present invention is described based on further specific examples and the present invention is not limited thereto.

Examples 1 to 4 and Comparative Examples 1 to 5

First, as raw materials of $Sr_2Ta_2O_7$ sintered body used as a target for forming thin film, a $SrCO_3$ powder and a $Ta_2O_5$ powder were prepared. The $SrCO_3$ powder and the $Ta_2O_5$ powder were weighed so that a molar ratio of Sr/Ta was 1.

Next, the $SrCO_3$ powder and the $Ta_2O_5$ powder were mixed for 16 hours by a wet ball mill using an ethanol solvent, thereby a mixed slurry was obtained.

Then, the mixed slurry was dried for 12 hours at 80° C. by a constant temperature dryer, thereby a mixed product was obtained.

Next, the mixed product was lightly crushed in a mortar, then placed in a ceramic crucible. Then, a heat treatment was carried out for 2 hours at 1000° C. in air atmosphere using an electric furnace. Thereby, a calcined product was obtained.

Next, the calcined product was crushed in a mortar, and then finely pulverized for 16 hours by a wet ball mill using water or ethanol as a solvent, thereby a calcined slurry was obtained.

The obtained calcined slurry was dried for 12 hours at 80° C. in a constant temperature dryer, thereby a calcined mixed product was obtained.

To the calcined mixed product, a polyvinyl alcohol solution as a binder was added and mixed, thereby a granulated powder was obtained. An added amount of the polyvinyl alcohol solution was 0.6 wt % with respect to 100 wt % of the granulated powder.

The granulated powder was molded into a circular disk shape having a diameter of about 23 mm and a thickness of about 9 mm, thereby a molded article was obtained. As a molding method, a CIP method was used.

The molded article was subjected to a binder removal treatment at 1400° C. for 2 hours, thereby a sintered product was obtained. Further, upper and lower surfaces of the sintered product were mirror polished and the target for forming thin film having a height of 5 mm was obtained. Note that, an obtained target for forming thin film had a relative density of 96 to 98%.

The target for forming thin film obtained as such was placed in the film forming machine, and the Si substrate was provided so that it faces against the target for forming thin film. The Si substrate having Pt film as a first electrode on the surface was used.

Next, a metal oxide thin film was formed by a PLD method so that a thickness was 400 nm. An oxygen partial pressure in the atmosphere while forming the metal oxide thin film (film forming oxygen partial pressure) was varied in each example and comparative example. Specifically, the film forming oxygen partial pressure was set to as shown in Table 1. Also, a temperature while forming the metal oxide thin film was 700° C., and nitrogen was not introduced in the atmosphere when the metal oxide thin film was being formed.

Note that, in Example 4, oxygen was not introduced in the atmosphere. However, due to the ability of a vacuum machine, oxygen of 0.001 Pa or so may exist at most in the atmosphere.

Next, in Examples 1 to 3 and Comparative example 1, a radical nitriding treatment was performed by irradiating nitrogen radicals for 10 minutes to the surface of the metal oxide thin film, thereby a dielectric thin film having an A-B—O—N type oxynitride was obtained.

For the dielectric thin film obtained in Examples 1 to 3 and Comparative example 1, content ratios of Sr, N, and O at the surface of the dielectric thin film and content ratios of Sr, N, and O at the inner part of the dielectric thin film were quantified by PHI Quantera II™ made by ULVAC-PHI, Inc. Also, Sr ion valence and Ta ion valence were determined by a chemical shift of XPS, and it was verified that the valences did not change from the raw materials. Specifically, a valence of Sr ion was 2, and a valence of Ta ion was 5. Also, values of (o+n)/a, o/a, and n/a at the inner part of the dielectric thin film were calculated from the values quantified by an X-ray photoelectron spectroscopy. The results are shown in Table 2. Note that, Example 3 and Comparative example 1 had quite an amount of N at least in the surface part of the dielectric thin film, thus due to diffusion of N from the surface part to the inner part of the dielectric thin film, it is speculated that a N content in the inner part of the dielectric thin film was 0.0001 mol % or more.

Further, values of (o1+n1)/a1, o1/a1, and n1/a1 at the surface of the dielectric thin film was calculated from the value quantified by an X-ray photoelectron spectroscopy.

Also, the XRD pattern of the dielectric thin film of Examples 1 to 3 and Comparative example 1 confirmed that the dielectric thin films of Examples 1 to 3 and Comparative example 1 were all polycrystalline films. That is, the thin film was crystallized and formed a polycrystalline thin film.

Also, using the XRD patterns of the dielectric thin films of Examples 1 to 4 and Comparative examples 1 to 5, a crystal structure of each dielectric thin film was verified whether it had a perovskite structure or a non-perovskite structure. Results are shown in Table 1.

Then, each dielectric thin film of Examples 1 to 4 and Comparative examples 1 to 5 was subjected to a deposition to form an Ag electrode, and a relative permittivity and a dielectric loss (tan δ) were measured. The relative permittivity and tan δ were measured by an impedance analyzer 4294A (made by Agilent) at a measuring voltage: 100 mV and a measuring frequency: 1 kHz. A relative permittivity of 800 or more was considered good; and tan δ of less than 1 (less than 100%) was considered good and 0.1 or less (10% or less) was considered even better. Results are shown in Table 1.

TABLE 1

|  | Target composition | Film composition | Film forming oxygen partial pressure (Pa) | Radical nitriding irradiation time (min) | Crystal structure | Relative permittivity (1 kHz) | tan δ | (o + n)/a |
|---|---|---|---|---|---|---|---|---|
| Example 1 | Sr2Ta2O7 | Sr-Ta-O-N | 0.01 | 10 | Non-perovskite | 1600 | 15% | 2.84 |
| Example 2 | Sr2Ta2O7 | Sr-Ta-O-N | 0.1 | 10 | Non-perovskite | 1100 | 5% | 2.77 |
| Example 3 | Sr2Ta2O7 | Sr-Ta-O-N | 1 | 10 | Non-perovskite | 800 | 13% | 2.82 |
| Comparative example 1 | Sr2Ta2O7 | Sr-Ta-O-N | 10 | 10 | Perovskite | 600 | 13% | 3.27 |
| Comparative example 2 | Sr2Ta2O7 | Sr-Ta-O | 0.01 | 0 | Non-perovskite | — | >100% | Not measured |
| Comparative example 3 | Sr2Ta2O7 | Sr-Ta-O | 0.1 | 0 | Non-perovskite | — | >100% | Not measured |
| Comparative example 4 | Sr2Ta2O7 | Sr-Ta-O | 1 | 0 | Non-perovskite | 30~70 | 459 | Not measured |
| Comparative example 5 | Sr2Ta2O7 | Sr-Ta-O | 10 | 0 | Perovskite | 30~70 | 1% | Not measured |
| Example 4 | Sr2Ta2O7 | Sr-Ta-O-N | ≤0.001 | 10 | Non-perovskite | 1800 | 14% | 2.80 |

TABLE 2

|  | Surface part of dielectric thin film | | | | | | Inner part of dielectric thin film | | | | | |
|---|---|---|---|---|---|---|---|---|---|---|---|---|
|  | Sr(mol %) | N(mol %) | O(mol %) | n1/a1 | o1/a1 | (o1 + n1)/a1 | Sr(mol %) | N(mol %) | O(mol %) | n/a | o/a | (o + n)/a |
| Example 1 | 23.5 | 6.37 | 61.7 | 0.271 | 2.628 | 2.899 | 20.7 | 0.276 | 58.5 | 0.013 | 2.823 | 2.836 |
| Example 2 | 23.4 | 6.54 | 60.6 | 0.279 | 2.588 | 2.867 | 21.2 | 0.011 | 58.7 | 0.001 | 2.768 | 2.768 |
| Example 3 | 22.1 | 10.09 | 58.0 | 0.456 | 2.621 | 3.078 | 20.9 | <0.001 | 58.9 | <0.001 | 2.817 | 2.817 |
| Comparative example 1 | 19.3 | 9.03 | 59.8 | 0.468 | 3.104 | 3.572 | 18.4 | <0.001 | 60.3 | <0.001 | 3.268 | 3.268 |

According to Tables 1 and 2, in Examples 1 to 3 and Comparative example 1, the A-B—O—N type oxynitride was formed at least to the surface of the dielectric thin film. Further, Examples 1 to 3 in which (o+n)/a was smaller than 3.00 at the inner part of the dielectric thin film had good relative permittivity and tan δ. On the other hand, in Comparative example 1 in which (o+n)/a was 3.00 or more, a relative permittivity decreased.

Comparative examples 2 to 5 in which the radical nitriding treatment was not performed formed a metal oxide thin film having SrTaO$_x$, and the N content was less than 0.0001 mol %. Also, the relative permittivity and tan δ were worse than Examples 1 to 4.

Also, for each dielectric thin film of Examples 1 to 4 and Comparative example 1, a relative permittivity at a frequency of 1 MHz was measured. The relative permittivity of each dielectric thin film from Examples 1 to 4 decreased significantly as the frequency increased to 1 MHz. On the other hand, the relative permittivity of the dielectric thin film of Comparative example 1 did not decrease significantly even when the frequency was increased to 1 MHz. As a result, the relative permittivity of the dielectric thin film of Comparative example 1 at a frequency of 1 MHz was larger than the relative permittivity of each dielectric thin film from Examples 1 to 4.

Figure 2:
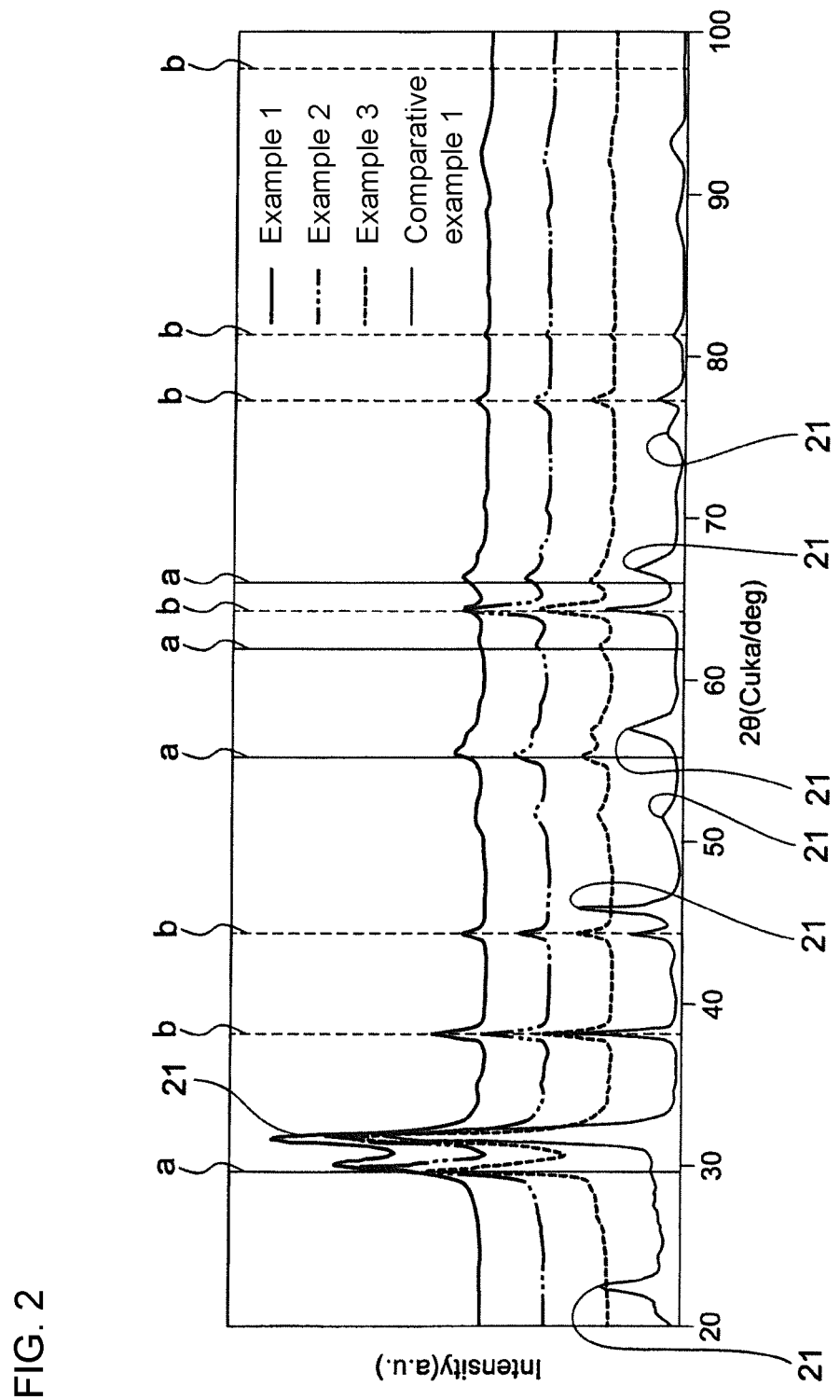
FIG. 2 is a graph showing XRD measurement results of Examples 1 to 3 and Comparative example 1.

Also, XRD profiles of Examples 1 to 3 and Comparative example 1 are shown in FIG. 2. Note that, a of FIG. 2 showed approximately same peak positions only in Examples 1 to 3, and β of FIG. 2 showed approximately same peak positions in Examples 1 to 3 and Comparative example 1. Note that, among β, peaks near 2θ=65 deg was a peak of Ag second electrode.

Comparative example 1 formed under oxygen partial pressure of 10 Pa showed a peak 21 which was similar to a peak of SrTaO$_2$N having a perovskite structure. On the contrary to this, Examples 1 to 3 formed under oxygen partial pressure of 0.01 to 1 Pa showed patterns having different peaks compared to the peaks of SrTaO$_2$N having a perovskite structure.

Also, common peaks only in Examples 1 to 3 shifted to higher angle side as the oxygen partial pressure decreased while forming the metal oxide thin film. That is, as the oxygen partial pressure decreased while forming the metal oxide thin film, the crystal lattice included in the dielectric thin film became smaller. The crystal lattice included in the dielectric thin film became smaller as the oxygen partial pressure decreased while forming the metal oxide thin film, because O defect increased as O deficiency occurred while forming the thin film. Further, as the oxygen partial pressure decreased while forming the thin film, nitrogen which was in a form of radial was introduced into the small crystal lattice. Thus, a crystal distortion increased in the obtained dielectric thin film, and it is thought that the relative permittivity increased.

Also, regarding Examples 1 to 3 and Comparative example 1 (the dielectric thin film made of oxynitride) and Comparative examples 2, 4, and 5 (the dielectric thin film made of oxide) which are shown in Table 1, a graph was made using oxygen partial pressure (P$_{O2}$) in a horizontal axis and tan δ in a vertical axis. Results are shown in FIG. 3.

Figure 3:
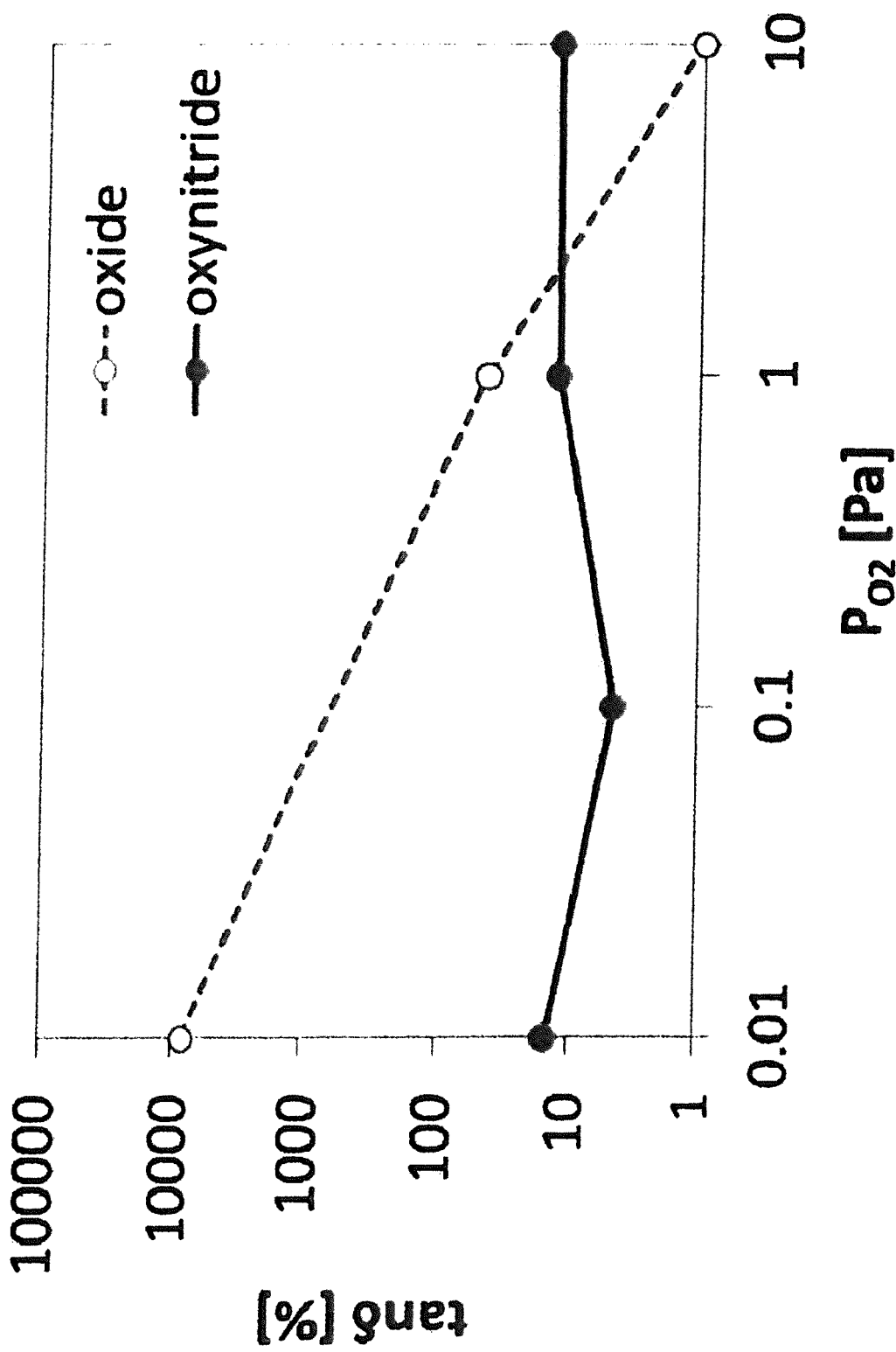
FIG. 3 is a graph showing a relation between an oxygen partial pressure and tan δ while forming the metal oxide thin film.

According to FIG. 3, when the dielectric thin film was made of oxides, tan δ of the dielectric thin film tended to deteriorate as the oxygen partial pressure decreased while forming the metal oxide thin film. This is because O in the atmosphere decreased as the oxygen partial pressure decreased while forming the metal oxide thin film, and O defect tended to occur easily to the dielectric thin film. On the other hand, when the dielectric thin film was made of oxynitrides, tan δ significantly improved particularly when the oxygen partial pressure was 1 Pa or less compared to the dielectric thin film made of oxides formed at the same oxygen partial pressure.

Examples 5 to 7

Examples 5 to 7 were performed under the same conditions as Example 2 except that the radical nitriding irradiation time was longer than Example 2. Results are show in Table 3.

TABLE 3

| | Target composition | Film composition | Film forming oxygen partial pressure (Pa) | Radical nitriding irradiation time (min) | Crystal structure | Relative permittivity (1 kHz) | tan δ | (o + n)/a |
|---|---|---|---|---|---|---|---|---|
| Comparative example 3 | Sr2Ta2O7 | Sr-Ta-O | 0.1 | 0 | Non-perovskite | — | >100% | Not measured |
| Example 2 | Sr2Ta2O7 | Sr-Ta-O-N | 0.1 | 10 | Non-perovskite | 1100 | 5% | 2.77 |
| Example 5 | Sr2Ta2O7 | Sr-Ta-O-N | 0.1 | 30 | Non-perovskite | 1000 | 5% | 2.79 |
| Example 6 | Sr2Ta2O7 | Sr-Ta-O-N | 0.1 | 100 | Non-perovskite | 850 | 4% | 2.73 |
| Example 7 | Sr2Ta2O7 | Sr-Ta-O-N | 0.1 | 350 | Non-perovskite | 700 | 6% | 2.88 |

As shown in Table 3, as the radical nitriding irradiation time was longer, the relative permittivity decreased. It is thought that the obtained dielectric thin was damaged by nitrogen radicals as the radical nitriding irradiation time became longer.

Also, for each dielectric thin film of Examples 5 to 7 and Comparative example 1, the relative permittivity at a frequency of 1 MHz was measured. The relative permittivity of each dielectric thin film of Examples 5 to 7 decreased significantly as the frequency increased to 1 MHz. On the other hand, the relative permittivity of the dielectric thin film of Comparative example 1 did not decrease significantly even when the frequency was increased to 1 MHz. As a result, at a frequency of 1 MHz, the relative permittivity of the dielectric thin film of the comparative example 1 was larger than the relative permittivity of each dielectric thin film of Examples 5 to 7.

Examples 8 and 9, and Comparative Examples 6 to 9

Example 8 and Comparative examples 6 and 7 were performed under the same conditions as Example 2 and Comparative examples 3 and 5 except that a sintered body used as a target for forming thin film was a $La_2Ti_2O_7$ sintered body. Also, Example 9 and Comparative examples 8 and 9 were performed under the same condition as Example 2 and Comparative examples 3 and 5 except that a sintered body used as a target for forming thin film was a sintered body equivalent of $Ba_2Ta_2O_7$. The sintered body equivalent of $Ba_2Ta_2O_7$ was made by weighing a $BaCO_3$ powder and a $Ta_2O_5$ powder so that Ba:Ta:O=2:2:7 was satisfied. A compound of $Ba_2Ta_2O_7$ does not actually exist and a compound of $Ba_2Ta_2O_7$ is not formed after sintering, thus it is referred as "a sintered body equivalent of $Ba_2Ta_2O_7$". Results are shown in Table 4.

TABLE 4

| | Target composition | Film composition | Film forming oxygen partial pressure (Pa) | Radical nitriding irradiation time (min) | Crystal structure | Relative permittivity (1 kHz) | tan δ | (o + n)/a |
|---|---|---|---|---|---|---|---|---|
| Example 2 | Sr2Ta2O7 | Sr-Ta-O-N | 0.1 | 10 | Non-perovskite | 1100 | 5% | 2.77 |
| Comparative example 3 | Sr2Ta2O7 | Sr-Ta-O | 0.1 | 0 | Non-perovskite | — | >100% | Not measure |
| Comparative example 5 | Sr2Ta2O7 | Sr-Ta-O | 10 | 0 | Perovskite | 30~70 | 1% | Not measured |
| Example 8 | La2Ti2O7 | La-Ti-O-N | 0.1 | 10 | Perovskite | 1200 | 8% | 2.79 |
| Comparative example 6 | La2Ti2O7 | La-Ti-O | 0.1 | 0 | Perovskite | — | >100% | Not measured |
| Comparative example 7 | La2Ti2O7 | La-Ti-O | 10 | 0 | Perovskite | 20~40 | 1% | 3.01 |
| Example 9 | equivalent of Ba2Ta2O7 | Ba-Ta-O-N | 0.1 | 10 | Non-perovskite | 900 | 10% | 2.83 |
| Comparative example 8 | equivalent of Ba2Ta2O7 | Ba-Ta-O | 0.1 | 0 | Non-perovskite | — | >100% | Not measured |
| Comparative example 9 | equivalent of Ba2Ta2O7 | Ba-Ta-O | 10 | 0 | Non-perovskite | 40~70 | 4% | 3.11 |

Table 4 shows that similar tendencies even when a type of the target for forming thin film was varied. Note that, a crystal structure of the dielectric thin film of Example 8 was a perovskite structure unlike a crystal structure of the dielectric thin film of other Examples. Further, the dielectric thin film of Example 8 had good relative permittivity and tan δ.

Also, for each dielectric thin film of Examples 8 and 9 and Comparative example 1, a relative permittivity at a frequency of 1 MHz was measured. The relative permittivity of each dielectric thin film of Examples 8 and 9 decreased significantly as the frequency increased to 1 MHz. On the other hand, the relative permittivity of the dielectric thin film of Comparative example 1 did not decrease significantly even when the frequency was increased to 1 MHz. As a result, the relative permittivity of the dielectric thin film of Comparative example 1 at a frequency of 1 MHz was larger than the relative permittivity of each dielectric thin film of Examples 8 and 9.

NUMERICAL REFERENCES

1 . . . Thin film capacitor
11 . . . Substrate
12 . . . First electrode
13 . . . Dielectric thin film
14 . . . Second electrode
21 . . . Peaks similar to a peak of $SrTaO_2N$

What is claimed is:

1. A capacitor element comprising a dielectric thin film, wherein
    the dielectric thin film consists of an A-B—O—N oxynitride, in which the A-B—O—N oxynitride is represented by a compositional formula of $A_aB_bO_oN_n$ that satisfies $(o+n)/a<3.00$,
    A and B are elements capable of forming an A-B—O oxide having a perovskite structure,
    A is one or more selected from Sr, Ba, Ca, La, Nd, Na, and K; and B is one or more selected from Ta, Nb, Ti, and W, and
    a crystal structure of the A-B—O—N oxynitride is a non-perovskite structure.

2. The capacitor element according to claim 1, wherein $(o+n)/a<2.95$ is satisfied.

3. The capacitor element according to claim 1, wherein $n/a\leq0.050$ is satisfied.

4. The capacitor element according to claim 1, wherein A is Sr and B is Ta.

5. The capacitor element according to claim 1, wherein A is La and B is Ti.

6. The capacitor element according to claim 1, wherein A is Ba and B is Ta.

* * * * *